US006853188B2

(12) United States Patent
Feinberg et al.

(10) Patent No.: US 6,853,188 B2
(45) Date of Patent: Feb. 8, 2005

(54) METHOD AND APPARATUS FOR REMOVING SPECIFIC STIMULATED ECHOES IN SIMULTANEOUS IMAGE REFOCUSING

(75) Inventors: David Feinberg, Bodega Bay, CA (US); Matthias Guenther, Sebastopol, CA (US)

(73) Assignee: Advanced MRI Technologies, LLC, Sebastopol, CA (US)

( * ) Notice: Subject to any disclaimer, the term of this patent is extended or adjusted under 35 U.S.C. 154(b) by 0 days.

(21) Appl. No.: 10/236,214

(22) Filed: Sep. 6, 2002

(65) Prior Publication Data

US 2003/0169042 A1 Sep. 11, 2003

Related U.S. Application Data

(63) Continuation-in-part of application No. 09/477,783, filed on Dec. 31, 1999, now Pat. No. 6,614,225.

(51) Int. Cl.[7] ............................................. G01V 3/00
(52) U.S. Cl. ...................................... 324/307; 324/309
(58) Field of Search ......................... 324/300, 307–309; 600/410

(56) References Cited

U.S. PATENT DOCUMENTS

| | | | |
|---|---|---|---|
| 5,109,854 A | | 5/1992 | Provost |
| 5,311,133 A | | 5/1994 | Dannels |
| 5,341,098 A | | 8/1994 | Hennig |
| 5,345,172 A | * | 9/1994 | Taguchi et al. .............. 324/309 |
| 5,378,985 A | * | 1/1995 | Hinks .......................... 324/309 |
| 5,528,145 A | * | 6/1996 | Hirata et al. ................. 324/309 |
| 5,568,050 A | | 10/1996 | Hennig |
| 5,808,467 A | * | 9/1998 | Ochi et al. ................... 324/309 |
| 6,034,528 A | | 3/2000 | Heid |
| 6,097,185 A | * | 8/2000 | Watanabe et al. ........... 324/309 |
| 6,127,824 A | | 10/2000 | Smith et al. |
| 6,160,397 A | * | 12/2000 | Washburn et al. ........... 324/309 |
| 6,208,136 B1 | | 3/2001 | Smith et al. |
| 6,256,526 B1 | | 7/2001 | Butts et al. |
| 6,304,084 B1 | * | 10/2001 | Star-Lack et al. ........... 324/307 |
| 6,369,568 B1 | * | 4/2002 | Ma et al. ..................... 324/309 |
| 6,380,741 B1 | * | 4/2002 | Hajnal et al. ................ 324/318 |
| 6,452,387 B1 | * | 9/2002 | Hargreaves et al. ......... 324/309 |
| 6,472,873 B2 | * | 10/2002 | Yamazaki .................... 324/309 |
| 6,614,225 B1 | * | 9/2003 | Feinberg ..................... 324/307 |

OTHER PUBLICATIONS

T. Loenneker, F. Hannel. J. Hennig, Multislice Interleaved Excitation Cycles (MUSIC): An Efficient Gradient–Echo Technique For FunctionalMRI, MRM 35:870–874 (1996).

D.A. Feinberg T.G. Reese, V.J. Wedeen, "Simultaneous Image Refocusing (SIR): a New Approach to Multi–slice MRI".

(List continued on next page.)

*Primary Examiner*—Diego Gutierrez
*Assistant Examiner*—Dixomara Vargas
(74) *Attorney, Agent, or Firm*—Cooper & Dunham LLP

(57) ABSTRACT

MRI method and apparatus using simultaneous image refocusing of multiple MRI slices that have different phase histories imparted by applying different amount of additional energy to the different slices before the first refocusing, in combination with applying novel fid spoiling that suppresses interference between stimulated echoes and spin echoes of different slices while allowing non-interfering stimulated echoes to be added to the appropriate primary echoes.

31 Claims, 5 Drawing Sheets

OTHER PUBLICATIONS

David Feinberg, Ph.D, and Jürgen Hennig, Ph.D., International Society For Magnetic Resonace In Medicine, FAST MRI WORKSHOP: Methodological Perspectives and Advances in Cardiac, Neuro, Angiography and Abdominal Imaging, SYLLABUS, Oct. 27–29, 1997, Asilomar Conference Center, Monterey, California, USA, pp. 1–5.

J.E. Bishop and D.B. Plewes, Ph.D. "A New Multi–slice Technique Based on TE–Interleaving" p. 437. J.E. Bishop and D.B. Plewes, Ph.D. "A New Multi–slice Technique Based on TE–Interleaving" p. 437.

J. Hennig, "Basic Concepts of Burst", pp. 126–128.

Peter M. Joseph, "Principles of Image Formation", Magnetic Resonance Imaging of the Brain and Spine, Second Edition, ed by Scott W. Atlas, Lippincott–Raven Publishers, Phliadelphia 1996, pp. 49–54.

P. Brunner and R.R. Ernst, "Sensitivity and Performance Time in NMR Imaging", pp. 83–106.

* cited by examiner

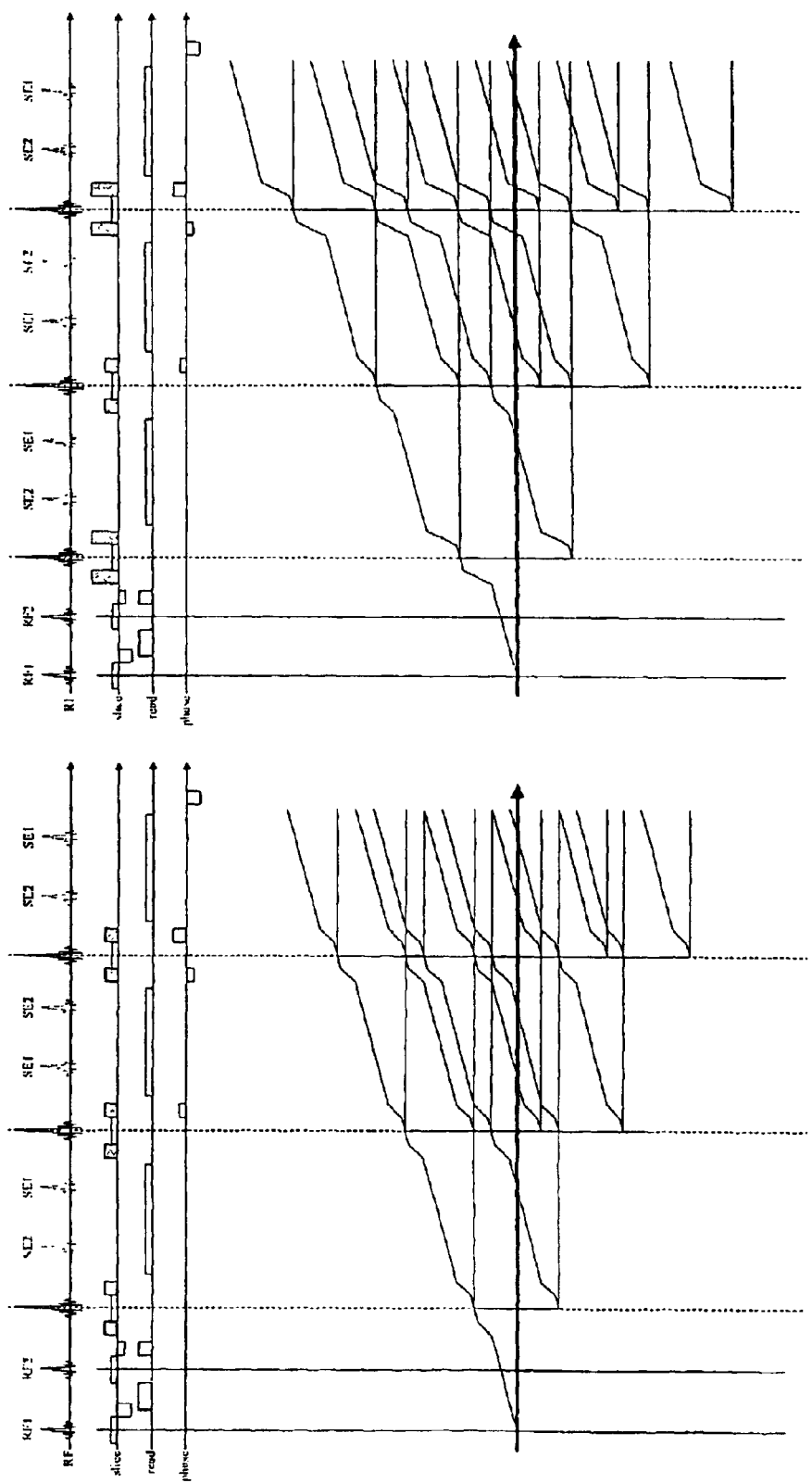

METHOD AND APPARATUS FOR REMOVING SPECIFIC STIMULATED ECHOES IN SIMULTANEOUS IMAGE REFOCUSING

REFERENCE TO RELATED APPLICATION

This patent application is a continuation-in-part of U.S. patent application Ser. No. 09/477,783 filed on Dec. 31, 1999 now U.S. Pat. No. 6,614,225, which is hereby incorporated herein in its entirety.

BACKGROUND AND SUMMARY OF THE DISCLOSURE

This patent specification is in the field of magnetic resonance imaging (MRI) and is directed to improvements including techniques particularly important in high field MRI.

The 1999 patent application referenced above describes simultaneous image refocusing (SIR) that includes giving each of several MRI slices a respective phase history different from that for other slices, for example by pulses on the read gradient (Gr) axis interspersed with the RF excitation pulses, and simultaneously refocusing all the slices several times in the same MRI signal acquisition sequence.

At higher MRI field strengths the RF penetration of the human body is markedly reduced. To compensate for this, the power of the RF pulses can be increased, but this in turn leads to an increased heating of the subject. Rapid spin echo (SE) sequences, also called turbo spin echo (TSE), fast spin echo (FSE), and rapid acquisition with relaxation enhancement (RARE), that use a large number of closely spaced high flip angle RF pulses, have to be slowed down considerably to prevent harming the patient. Currently offered 3T MRI scanners are examples of such issues, and higher fields would show an even greater reduction in RF penetration.

SIR-based TSE sequences help deal with the reduction of RF penetration with an increase of MRI field strength from two directions. First, their longer readout periods increase the spacing of the RF refocusing pulses. Second, the number of refocusing pulses they apply is significantly reduced because each RF pulse acts on several slices simultaneously. Therefore, the amount of deposited RF energy per unit time that has to be dissipated by the subject's body is much lower in SIR-based sequences, and sequences such as SIR TSE can be run faster or with larger slice coverage.

In SIR TSE sequences some of the stimulated echoes from the first slice may not all fall on top of the primary echo from the same slice but instead may interfere with the primary echo from the second slice (In an n-slice 3 slice SIR TSE sequence). One way to avoid such interference would be to spoil all stimulated echo pathways. This can be done by constantly increasing the spoiling pulse amplitude. This can suppress all the stimulated echo pathways efficiently but is usually limited by the maximum gradient strength of the scanner hardware. Another disadvantage of this approach is that all echo pathways are suppressed, including those that fall on the correct side of the readout and could contribute to the signal without interference. The approach disclosed in this patent specification removes both disadvantages—it suppresses the stimulated echoes that would interfere with the primary echoes from other slices while allowing the contribution of the non-interfering stimulated echoes, but does not require increases in gradient strength. The new approach thereby provides MRI benefits in addition to those from SIR alone.

Let us call the stimulated echoes of one slice, which fall on top of the primary echo of another other slice, the "wrong stimulated echo," and call the stimulated echoes that contribute to the primary echo of the same slice, the "right stimulated echoes". Wrong stimulated echoes result from echo pathways that miss an odd number of refocusing pulses. Since in SIR TSE sequences the position of the primary echo within the readout period changes every refocusing period, those wrong stimulated echoes may fall on top of the primary echo of another other slice and cause interference. Right stimulated echoes, on the other hand, miss an even number of refocusing pulses and fall on the correct side of the readout period. Since the position of the primary echo of one slice changes with a period of 2, the spoiling scheme should have the same period of 2. If the suitable gradient spoiling is chosen as a unit measure, a suitable spoiling scheme would be, e.g.:

(2,1,2,1,2,1,2,1, . . . ), or
(1,2,1,2,1,2,1,2, . . . ), or
(−1,1,−1,1,−1,1, . . . ), or
(2,3,2,3,2,3,2,3, . . . ), where successive numbers give the relative gradient momentum for successive refocusing periods.

The constraints are:
periodicity of 2
difference of momentums of spoiler pulses between refocusing periods at least one unit measure
total rephrasing of primary echo during readout period Such encoding of multiple spin echoes within the RF pulse train is a departure from conventional CPMG conditions that could raise concerns. However, this patent specification describes a novel periodic spoiler pulse scheme that selectively removes only the stimulated echoes that would interfere with the spin echo of an alternate slice but does not spoil the coherent stimulated echoes. The new method alternates gradient amplitudes between odd and even RF refocusing periods. This is different from earlier described methods of progressively increasing the amplitude of the spoiler pulses in non-CPMG sequences, which removes all of the stimulated echo magnetization. This is also different from Alsop's method (see reference 1) of RF spoiling half of the total signal in a non-CPMG sequence. The clinical application for SIR TSE described in this patent specification is suitable for T1-weighted imaging that uses fewer RF refocusings generating much less stimulated echo signal with 3 to 5 RF refocusings as compared to T2 imaging that typically uses more than 5 RF refocusings. An advantage of T1-weighted imaging is using centric k-space ordering that places the center of k-space on the first RF refocusing period, which does not have stimulated echoes. Using this scheme, the new approach described here can produce very high quality T1-weighted SIR TSE images of the brain and body, using no signal averaging. Phase cycling in two averages, removes the potential high frequency signal leakage from images. Examples of comparing two average SIR images with and without phase cycling found no detectable difference between the two sets of images, indicate freedom from artifacts from the overlap of high spatial frequency k-space. Preliminary findings in many different image acquisitions of different matrix sizes and sagittal, coronal and axial planes through the head and in phantoms indicate that without signal averaging or phase cycling, SIR TSE images are free of artifacts, appearing the same as conventional TSE images. Nevertheless, when using two or more signal averages, phase cycling removes spurious signal or artifact from high spatial frequency overlap or stimulated echoes without the need for spoiler pulses.

At 3T imaging where the signal-to-noise ratio (SNR) is expected to be 100% higher, the SIR TSE is not dependent on two averages, and therefore can be performed with large reduction in SAR (specific absorption ratio, which is a measure of RF heating of the subject), and increased slice coverage with the time-savings of a single-average acquisition. One proposal for a different approach to reducing SAR in TSE is discussed in Hennig and Scheffler (see reference 2).

The novel alternating amplitude spoiler scheme described here reduces signal amplitude progressively through the echo train. Examples of phantom and head measurements have indicated that the first echo data has 100% signal compared to conventional TSE, the second echo has 99%, and the third echo 97% for certain images. The amount of net stimulated echo spoiling is dependent on the RF excitation profiles, and is believed improvable with improvements in the 180° pulse slice profiles, which have not been optimized for SIR.

BRIEF DESCRIPTION OF THE DRAWINGS

FIG. 1A illustrates a sequence scheme and phase diagram for conventional spoiling of free induction decay (fid) artifacts.

FIG. 1B is similar to FIG. 1A but illustrates a new periodic spoiler scheme to suppress interference between stimulated echoes and spin (primary) echoes of different slices. Both FIGS. 1A and 1B only show the phase pathway for one of the excitation pulses (one slice). The gray shaded gradient pulses are the novel periodic spoiling scheme.

DETAILED DESCRIPTION

Figure 2A:
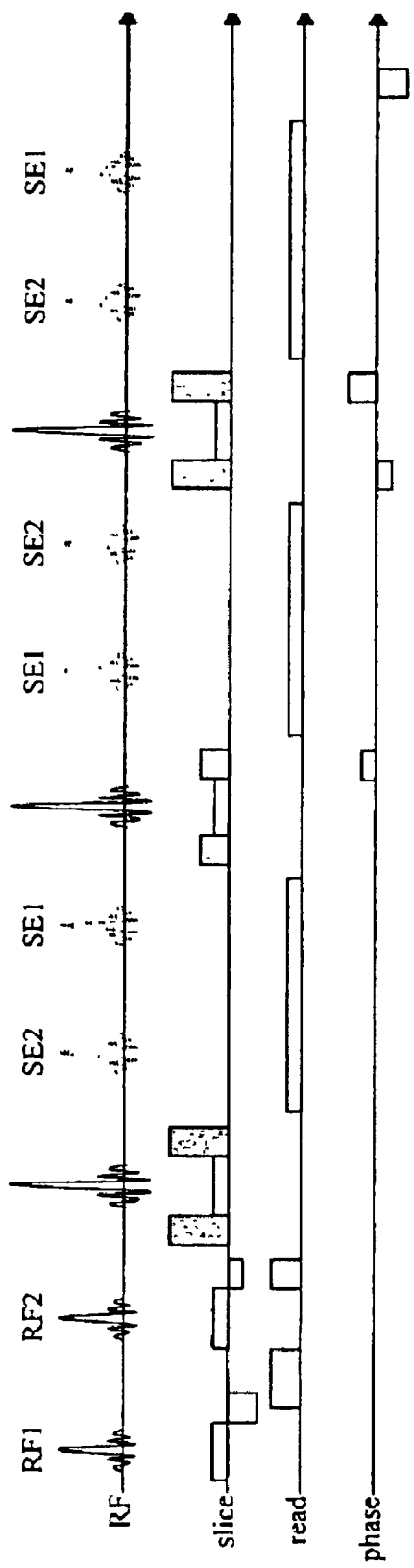
FIGS. 2A and 2B illustrate two versions of the novel periodic spoiling scheme using gradient pulses (shaded) to suppress interference between stimulated echoes and spin echoes of different slices.

FIG. 1A illustrates a multiple slice SE pulse sequence using the SIR approach discussed in the referenced 1999 patent application and also using known spoiling of fid artifacts. RF pulses RF1 and RF2 on the RF axis excite two respective MRI slices S1 and S2 defined by the illustrated pulses on the slice select axis, and are followed by a 180° pulse on the RF axis. In order to provide SIR benefits, the read axis gradients pulses include a first pulse that is temporally between the two RF pulses, and a second pulse that is temporally between the second RF pulse and the first 180° pulse. Spin echo MRI signals follow in time as illustrated, with an additional 180° RF pulse after each pair of MRI echo signals. The spoiling pulses on the slice select axis, shown as shaded blocks, temporally flank each 180° pulse to provide known spoiling of fid artifacts.

FIG. 1B illustrates a novel approach of varying the amplitude of the spoiling pulses on the slice axis. As illustrated, the amplitude is relatively high for the first 180° RF pulse, relatively low for the second 180° RF pulse, and the pattern repeats. Alternatively, the width of the spoiling pulses, or both the width and the amplitude, can be varied to thereby vary the pulse area. While the illustrated sequence shows only two slices, more than two can be used in the same sequence. While only three sets of SE MRI signals are expressly illustrated, more SE MRI signals can be acquired by using additional 180° RF pulses, flanked by appropriate spoiling pulses on the slice axis. In the case of using two slices, the spoiling pulse scheme should conform to the constraints discussed above concerning periodicity, difference in momentum of spoiler pulses between refocusing periods, and total rephasing of primary echo during readout period. If suitable gradient spoiling is chosen as a unit measure, an appropriate spoiling scheme can be, e.g, (2,1,2,1,2,1,2,1, . . . ), or (1,2,1,2,1,2,1,2, . . . ), or (−1,1,−1,1,−1,1, . . . ), or (2,3,2,3,2,3,2,3, . . . ), . . . , where successive numbers give the relative gradient momentum for successive refocusing periods. As earlier discussed, this example of spoiling pulses suppresses interference between stimulated echoes and spin echoes of different MRI slices. In each of FIGS. 1A and 1B, the lower graphs illustrate the phase of the stimulated echo signals caused by RF1. The vertical axis is phase amplitude, positive above the heavy line showing zero phase amplitude, and negative below that line. The horizontal axis is time, increasing to the right. The stimulated echo signals are detected when the phase graphs cross the zero line. In FIG. 1A (prior art) some of the zero cross overs overlap in time with the spin echos SE2 from the second slice. This is undesirable interference of stimulated echos from the first slice with the MRI spin echos from the second slice during read pulses. In contrast, in FIG. 1B such cross overs are shifted out of time overlap with the spin echos SE2 during the read periods defined by the read pulses.

Figure 2B:
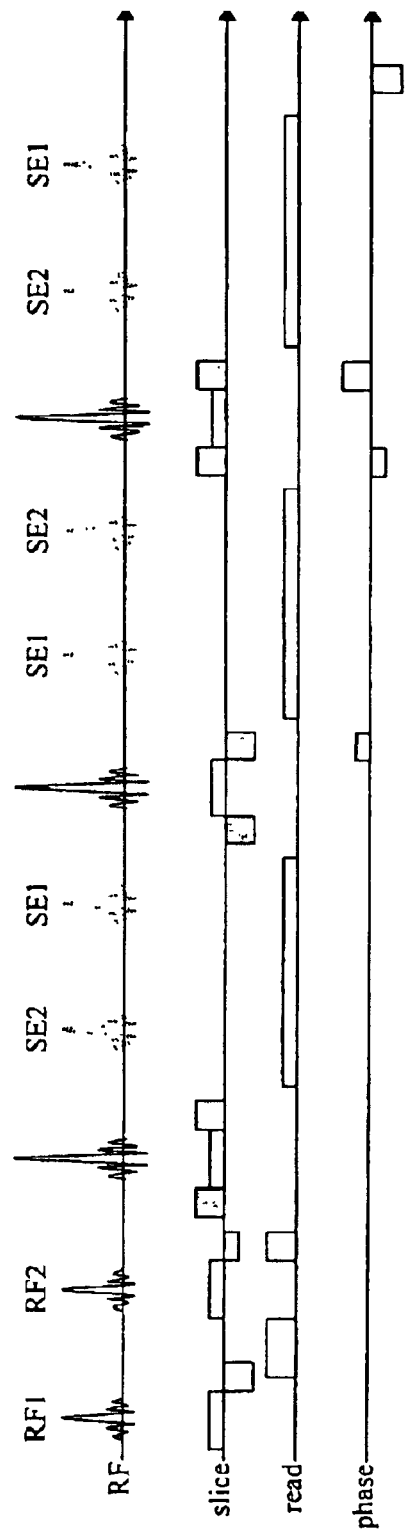

FIG. 2A is similar to FIG. 1B but omits the phase diagram. FIG. 2B illustrates a variation with the same RF pulses, read gradient pulses, and phase gradient pulses, but with a difference on the slice select gradient axis—the spoiler pulses (shaded blocks) alternate in polarity while maintaining essentially the same amplitude and width. Other combinations of spoiling and possible and are within the scope of this patent disclosure to achieve the same or similar result of suppressing interference between stimulated echoes and spin echoes of different MRI slices by changing the spoiling pulses from one refocusing to the next. For example, gradient pulses on other axes can be used for the same or similar purpose, such as in the gradient axes such as the read and phase encode axes. Using such interference suppressing pulses on the slice select gradient axis may be preferable in many cases, since the slice thickness is often greater than the in-plane resolution, which allows weaker gradients to achieve a 2π-phase shift within a voxel. The constraint for the spoiling scheme for the case of two slices is the periodicity of 2 RF pulse intervals using different net area of gradient in each gradient pulse pair. This would always spoil the magnetization that falls on the "wrong" side of the readout where it would interfere with the "right" MRI signal from the other slice.

Figure 3:
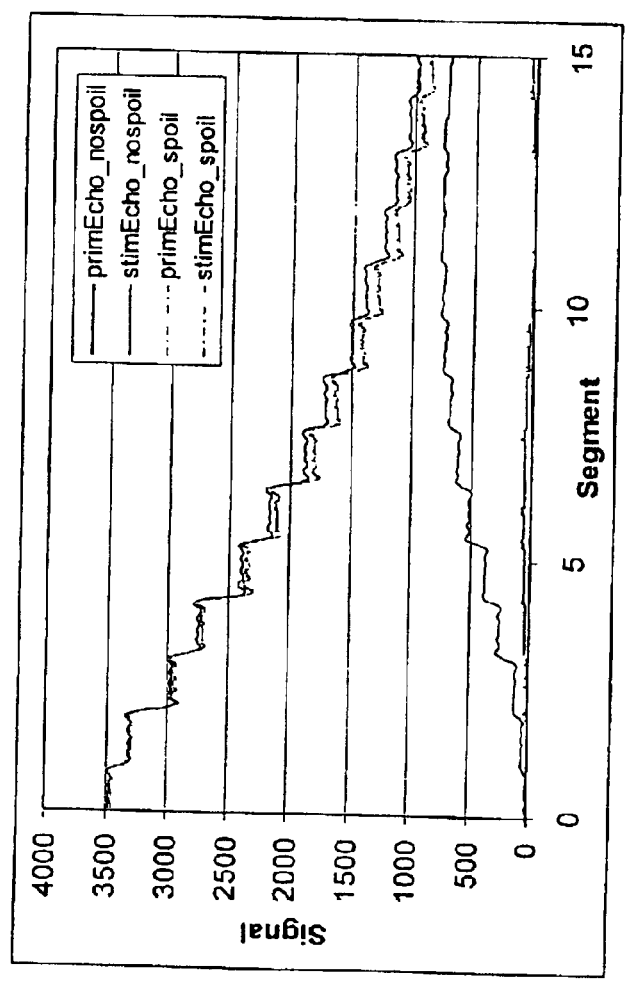
FIG. 3 illustrate the efficiency of the noel spoiling scheme. The top plots illustrate signal at the spin echo position at different RF refocusing time intervals between RF pulses for the SIR-TSE with 15 RF refocusings (15 RF 180° pulses) with and without spoiling. The lower plots illustrate the accumulative amplitude of the spoiled stimulated echoes that would interfere with the spin echo signals of the alternate slice. Signals were separated by phase cycling for these measurements.

FIG. 3 illustrates an efficiency benefit of the new periodic spoiling scheme. The top plots show MRI signal at the spin echo position at different RF refocusings time intervals between RF pulses for the SIR-TSE with 15 RF refocusings (15 RF 180° pulses) with and without spoiling. The lower plots show the accumulative amplitude of the spoiled stimulated echoes that would interfere with the spin echo signals of the alternate slice. Signals were separated by phase cycling for these measurements.

Figure 4:
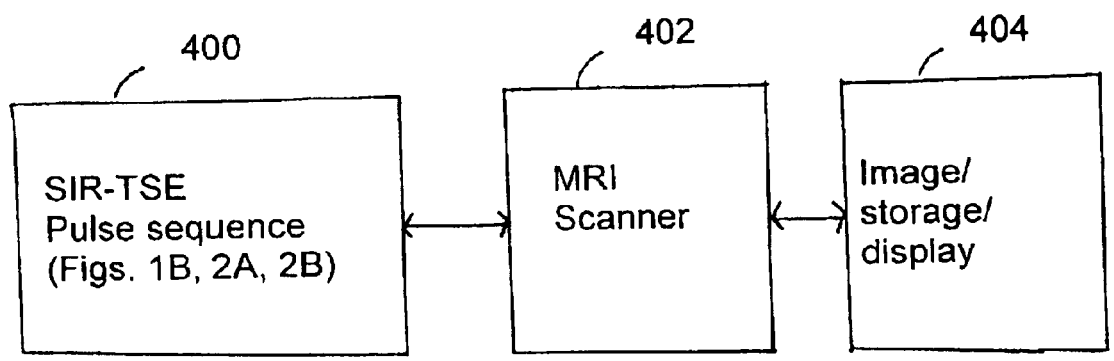
FIG. 4 illustrates a block diagram of an MRI system, according to an embodiment of the present application.

The novel suppression of interference can be applied to known MRI scanners, such as a 3T MRI scanner currently offered by a number of manufactures, through a suitable modification of the software to provide a pulse sequence such as illustrated in FIGS. 1A, 2A, and 2B, using ordinary skill in the art and the disclosure herein. A block diagram of and MRI apparatus using the novel scheme is illustrated in FIG. 4, where a source 400 stores and provides an SIR-TSE pulse sequence of the type discussed above that has been translated into a format suitable for a particular MRI scanner 402. Scanner 402 carries out corresponding SIR-TSE scanning of a subject, reconstructs MRI images using known techniques, and stores and/or displays the image at unit 404.

While specific examples have been discussed above, the invention can be implemented in other examples, and its scope defined by the appended claims is not limited to the specific disclosed examples.

Cited References:

1) D.C. Alsop, Phase insensitive preparation of single-shot rare: application to diffusion imaging in humans, MAGN. Reson. Med. 38, 527–533 (1997);
2) T. Loeneker, F. Hennel, J. Hennig, Multislice Interleaved Excitation Cycles (Music): An efficient gradient—Echo Technique For Functional MRI, MRM 35:870–874 (1996).

What is claimed is:

1. An magnetic resonance imaging (MRI) method comprising:
   carrying out a multislice rapid spin echo sequence for least a first MRI slice and a second MRI slice of a subject;
   said spin echo sequence being modified to (a) give the first MRI slice a phase history different from that of the second MRI slice by applying additional energy to the first MRI slice at a time the second MRI slice is not yet selected, (b) simultaneously refocusing the first and second MRI slices multiple times, and (c) applying free induction decay (fid) spoiling pulses to the first and second slices that differ from one simultaneous refocusing to the next; and
   acquiring MRI signals from the two slices at times related to said simultaneous refocusing and processing the acquired signals into MRI slice images.

2. A method as in claim 1, in which the spoiling pulses alternate between a first type for the first slice and second type for the second slice, and said first and second types differ from each other at least in one of amplitude, width, and polarity.

3. A method as in claim 2, in which the two types differ at least in amplitude.

4. A method as in claim 2, in which the two types differ at least in polarity.

5. A method as in claim 2, in which the two types differ at least in width.

6. A method as in claim 1 in which said spoiling pulses differ to suppress stimulated echoes from each of said first and second slices that match in time primary echoes from the other one of said first and second slices.

7. A method as in claim 6 in which said spoiling pulses differ at least in amplitude from one refocusing to the next.

8. A method as in claim 6 in which said spoiling pulses differ at least in polarity from one refocusing to the next.

9. A method as in claim 1 in which said additional energy is applied to said first and second MRI slices on a read gradient axis.

10. A method as in claim 1 in which said spoiling pulses are applied on a slice select gradient axis.

11. A method as in claim 1 in which said spoiling pulses differ at least in amplitude from one refocusing to the next.

12. A method as in claim 1 in which said spoiling pulses differ at least in polarity from one refocusing to the next.

13. A method as in claim 1 in which said spoiling pulses comprise a first pair of pulses each having a first amplitude and a second pair or pulses each having a second amplitude different from the first amplitude.

14. A method as in claim 8 in which each of said pairs comprises a first pulse starting before, and a second pulse ending after, a respective refocusing.

15. A method as in claim 1 in which the order of said stimulated spin echoes from said first and second MRI slices changes after each simultaneous refocusing.

16. A method as in claim 1 in which said processing of the acquired MRI signals into image data comprises centric k-space ordering that places a center of k-space at the first of said refocusing times.

17. A method as in claim 1 in which said processing of the acquired MRI signals into image data comprises using non-averaged MRI signals.

18. A method as in claim 1 in which said sequence is a T1-weighed sequence.

19. A method as in claim 1 in which said multiple refocusing times comprise refocusing from two to five times.

20. A method as in claim 1 in which the order of said stimulated spin echoes from said first and second MRI slices changes after each simultaneous refocusing.

21. An MRI system comprising:
    a source of a multislice rapid spin echo pulse sequence modified to (a) simultaneously refocus at least a first MRI slice and a second MRI slice of a subject multiple times, (b) give said first and second MRI slices different phase histories by applying a first additional energy to the first slice and a second additional energy to both slices before said simultaneous refocusing, and (c) apply free induction decay (fid) spoiling pulses that differ from one simultaneous refocusing to the next;
    an MRI scanner coupled with said source to receive said pulse sequence and carry out an MRI scan of said first and second MRI slices of the subject in accordance therewith to acquire MRI signals and reconstruct image data for said slices; and
    a display coupled with said scanner to display MRI slice images related to said image data.

22. An MRI system as in claim 21 in which said fid spoiling pulses differ to suppress stimulated echoes from one of said first and second MRI slices that would occur at a times matching primary echoes from the other one of said first and second MRI slices.

23. An MRI system as in claim 21 in which said source provides said sequence modified to give said different phase histories by applying said additional energy on a read gradient axis.

24. An MRI system as in claim 23 in which said source provides said sequence modified to give said different phase histories by applying a first pulse of said additional energy on a read gradient axis after a slice select pulse selecting said first slice and a second pulse of said additional energy on said gradient axis after a slice select pulse selecting said second slice.

25. An MRI system as in claim 21 in which said source provides said sequence modified to make said spoiling pulses differ from one refocusing to the next at least in amplitude.

26. An MRI system as in claim 21 in which said source provides said sequence modified to make said spoiling pulses differ from one refocusing to the next at least in polarity.

27. An MRI system as in claim 21 in which said source provides said sequence modified to make said spoiling pulses comprise a first pulse applied before, and a second pulse ending after, a respective refocusing. A method as in claim 1 in which said processing of the acquired MRI signals into image data comprises centric k-space ordering that places a center of k-space at the first of said refocusing times.

28. An MRI system as in claim 21 in which said MRI reconstructs said image data for said slices using non-averaged MRI signals.

29. An MRI system as in claim 21 in which said sequence said MRI scanner receives from said source is a T1-weighed sequence.

30. An MRI system as in claim 21 in which said multiple refocusing times comprise refocusing from two to five times.

31. An MRI system as in claim 21 in which said MRI scanner acquires said MRI signals from said first and second MRI slices in an order that changes after each simultaneous refocusing.

* * * * *